US007103813B1

(12) United States Patent
Tracy et al.

(10) Patent No.: US 7,103,813 B1
(45) Date of Patent: Sep. 5, 2006

(54) METHOD AND APPARATUS FOR TESTING INTERCONNECT BRIDGING FAULTS IN AN FPGA

(75) Inventors: Paul Tracy, Sunnyvale, CA (US); Anthony Pang, San Jose, CA (US); Andy Lee, San Jose, CA (US); Adam Wright, Saratoga, CA (US); Rahul Saini, Union City, CA (US)

(73) Assignee: Altera Corporation, San Jose, CA (US)

( * ) Notice: Subject to any disclaimer, the term of this patent is extended or adjusted under 35 U.S.C. 154(b) by 470 days.

(21) Appl. No.: 10/703,400

(22) Filed: Nov. 6, 2003

(51) Int. Cl.
*G01R 31/02* (2006.01)
*G06F 11/267* (2006.01)

(52) U.S. Cl. .......................................... 714/725; 716/16
(58) Field of Classification Search ................ 714/725, 714/742; 716/16
See application file for complete search history.

(56) References Cited

U.S. PATENT DOCUMENTS

| 6,725,442 | B1 * | 4/2004 | Cote et al. ..................... 716/16 |
| 6,933,747 | B1 * | 8/2005 | Bauer et al. .................. 326/38 |
| 6,996,758 | B1 * | 2/2006 | Herron et al. ............... 714/726 |

OTHER PUBLICATIONS

"A Low Cost Approach for Detecting, Locating, and Avoiding Interconnect Faults in FPGA-Based rReconfigurable Systems" Das et al. in VLSI Design Proceedings 1999 pub date Jan. 7-10, 1999.*
Toutounchi, Shahin et al.; "FPGA Test and Coverage"; *Proceedings of the International Test Conference*, 2002, pp. 599-607.

* cited by examiner

*Primary Examiner*—Guy Lamarre
*Assistant Examiner*—Cynthia Britt
(74) *Attorney, Agent, or Firm*—Townsend and Townsend and Crew LLP

(57) ABSTRACT

A bridging fault detection system allows for a high amount of test coverage using a low number of test configurations. The bridging fault detection system automatically creates optimal test configurations and test vectors without the need for precise layout information, and is adaptable to complex programmable device architectures. Testers can specify a precise level of testing coverage to optimize the testing processing. A programmable device with interconnect bias circuitry decreases the number of test configurations and thus the time needed to test for bridging faults. The interconnect bias circuit provides explicit test control over the unused lines in a configuration, driving them both high and low for complete test coverage between each line and all of its possible neighbors. The bridging fault detection system balances the available number of control test points against the number of interconnect segments stitched together by programmable connection to maximize the lines under test per configuration.

36 Claims, 8 Drawing Sheets

METHOD AND APPARATUS FOR TESTING INTERCONNECT BRIDGING FAULTS IN AN FPGA

BACKGROUND OF THE INVENTION

Programmable devices, such as SRAM-based FPGAs, can be rapidly reconfigured to perform many different functions. Typically, programmable devices include a number of different functional units connected by programmable interconnections. The functions of programmable device are determined by configuration data, which defines the configuration of the functional units and the programmable interconnections between them. This, in turn, defines the overall functions of the programmable device.

One common type of defect in all semiconductor devices is a bridging fault. A programmable device typically implements programmable interconnections as one or more layers of a large number of closely-spaced conductive lines, typically made of metal or other electrically conductive materials. Due to variability in the manufacturing process, adjacent conductive lines can be unintentionally short-circuited together. This type of defect is referred to as a bridging fault. Bridging faults can arise from numerous sources, such as an excess of conductive material remaining between the conductive lines, or defects in the multiplexers or other control circuitry used to selectively connect the conductive lines to functional units, power supplies, and inputs and outputs of the programmable device.

Detecting bridging faults requires driving adjacent conductive lines to opposite electrical states, for example ground and Vcc, and observing the outputs of the conductive lines. If a pair of adjacent conductive lines can be driven to opposite states, there are no bridging faults between the pair of adjacent conductive lines. Because of their large number of programmable interconnects, typical programmable devices can have tens of thousands of conductive lines or more. In contrast to the large number of programmable interconnects, programmable devices typically have a relatively limited number of inputs and outputs. As testing each pair of adjacent conductive lines requires a minimum connection with two unique control points, which drive each line to opposite states, and one observation point, testing an entire programmable device requires reconfiguration with thousands of different sets of test configuration data to connect all of the conductive lines. This increases the time, and consequently the cost, of testing for programmable devices.

FIGS. 1A and 1B illustrate prior systems that improve the performance of testing for bridging faults. FIG. 1A illustrate programmable device 100 having an implicit control system and including adjacent conductive lines 105 and 110. Due to a manufacturing defect, a bridging fault 115 exists between lines 105 and 110. To detect bridging fault 115, line 105 is connected to control input 125, which is used to drive line 105, and output 130, which is used to observe the state of line 105. Line 110 is not connected to any control input. Instead, programmable device 100 includes a half latch that automatically drives all unconnected lines, such as line 110, to a default electrical state, for example Vcc. As unconnected lines can be implicitly driven to a default electrical state without a control input, there are more control inputs available for testing, decreasing the number of test configurations needed.

However, full bridging fault test coverage cannot be achieved with the implicit control method. If the half latch driving unconnected lines high is stronger than the control input driving an adjacent line low, the output of the adjacent line will be high and the bridging fault will be observed. Conversely, if the half latch driving unconnected lines high is weaker than the control input driving an adjacent line low, the output of the adjacent line will be low, as expected, and the bridging fault will be undetected. Thus, in an implicit control system, even if every line is explicitly controlled and observed once, only 50% of the possible faults can be covered.

One prior alternate way to make bridging fault test generation more tractable is to narrow down the breadth of the test by explicitly driving each conductive line coming into a multiplexer via other resources. FIG. 1B illustrates a programmable device 150 in which testing is narrowed to a set of multiplexer inputs. Adjacent conductive lines 155 and 160 are connected to a multiplexer 170 and have a bridging fault 165. To detect bridging fault 165, lines 155 and 160 are driven to opposite electrical states and the output of the multiplexer is observed as it is selectively connected to each of its inputs.

The difficulty with this type of bridging fault test arises in attempting to identify and track adjacent conductive lines. Precise layout information is huge and is hard for the software to manage it efficiently. Additionally, some defects in multiplexers manifest as bridging faults between lines that may or may not be physical neighbors. This means that every line must be treated as if it had the possibility to be bridged to any other line, thereby requiring a large number of tests.

The difficulties of detecting bridging faults are further exacerbated by the increased flexibility of more advanced programmable devices. Programmable devices typically had indivisible conductive lines that ran the entire width of the device. However, more recent programmable devices allow conductive lines to be divided into segments less than the width of the device, and selectively connected to neighboring conductive lines. This increases the flexibility and routing capability of the programmable device, which improves the utilization of programmable device resources, but increases the potential for bridging faults.

It is therefore desirable for a bridging fault detection system to allow for a high amount of test coverage using a low number of test configurations. It is further desirable that the bridging fault detection system automatically create optimal test configurations and test vectors without the need for precise layout information, and be readily adaptable to complex programmable device architectures. It is still further desirable that the bridging fault detection system allow testers to specify a precise level of testing coverage.

BRIEF SUMMARY OF THE INVENTION

The invention includes a bridging fault detection system that allows for a high amount of test coverage using a low number of test configurations and further enables the bridging fault detection system to automatically create optimal test configurations and test vectors without the need for precise layout information. An embodiment of the invention is readily adaptable to complex programmable device architectures. A further embodiment of the invention includes interconnect bias circuitry to decrease the number of test configurations and thus the time needed to test for bridging faults. The interconnect bias circuit provides explicit test control over the unused lines in a configuration, driving them both high and low for complete test coverage between each line and all of its possible neighbors. An embodiment of the invention balances the aspect ratio of the available number of control test points against the number of interconnect segments stitched together by programmable connection to maximize the lines under test per configuration.

In an embodiment, a method for creating a test program for detecting bridging faults in a programmable device comprises forming a set of chains adapted to detect at least one potential bridging fault and partitioning the set of chains into a control subset associated with at least one control test point and a bias subset associated with at least one bias source. The set of chains are also partitioned into an observation subset and a nonobservation subset. A test configuration and a test vector are created to drive at least one set of test values on the control subset and to drive at least one bias value on the bias subset. The test vector is adapted to drive a set of test values on the set of chains, such that each chain has a state opposite to the state of each of the other chains of the set for at least one test value. The test configuration is further adapted to observe the output of the observation subset.

In an embodiment, the method includes the further steps of removing the observation subset from the set of chains, thereby forming a reduced set of chains, and repeating the step of partitioning into an observation subset and a nonobservation subset and the step of creating a test configuration and a test vector for the reduced set of chains. In another embodiment, the method includes the steps of removing the control subset from the set of chains, thereby forming a reduced set of chains. The steps of partitioning into a control subset and a bias subset, of partitioning into an observation subset and a nonobservation subset, and of creating a test configuration and a test vector for the reduced set of chains are repeated for the reduced set of chains.

In yet another embodiment, a set of chains is formed from a primary set of chains based upon the connectivity of a set of resources of the programmable device, and a complement set of chains based upon the primary set of chains. In one embodiment, the primary set of chains is specified by a set of user directives. In still another embodiment, the complement set of chains is determined using an optimization algorithm.

In an additional embodiment, a control test point is associated with each chain of the control subset. In an alternate embodiment, a control test point is associated with at least two chains of the control subset.

In still another embodiment, the bias source is a test point of the programmable device connected with the chains of the bias subset and adapted to drive the chains of the bias subset to a bias value. In an alternate embodiment, the bias source is an interconnect bias circuit of the programmable device adapted to drive chains unconnected with control test points to a bias value. The interconnect bias circuit is adapted to receive a bias value from a bias pin of the programmable device, or alternatively from a register of the programmable device.

BRIEF DESCRIPTION OF THE DRAWINGS

The invention will be described with reference to the drawings, in which.

DETAILED DESCRIPTION OF THE INVENTION

Figure 1A:
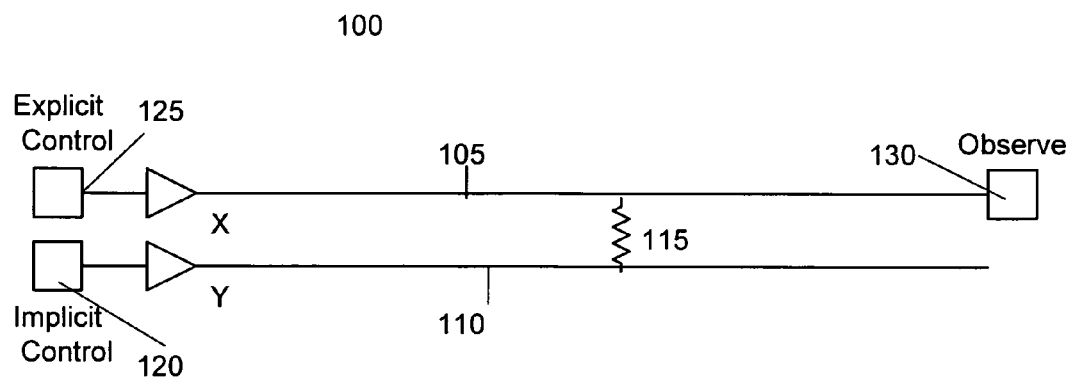
FIGS. 1A and 1B illustrate prior methods of testing for bridging faults.
Figure 1B:
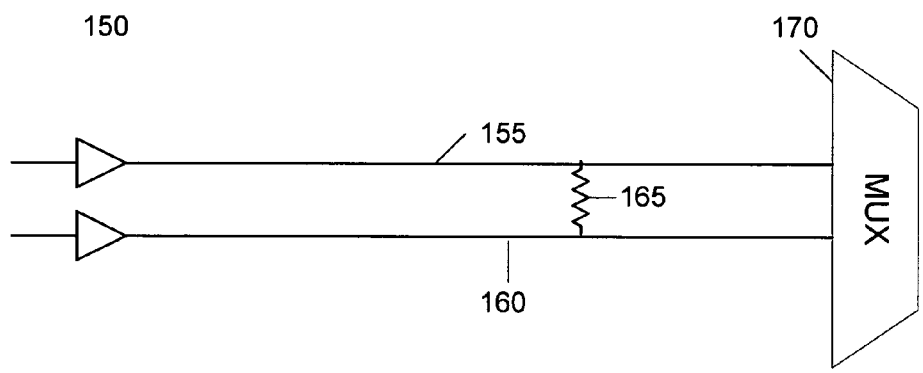
Figure 2A:
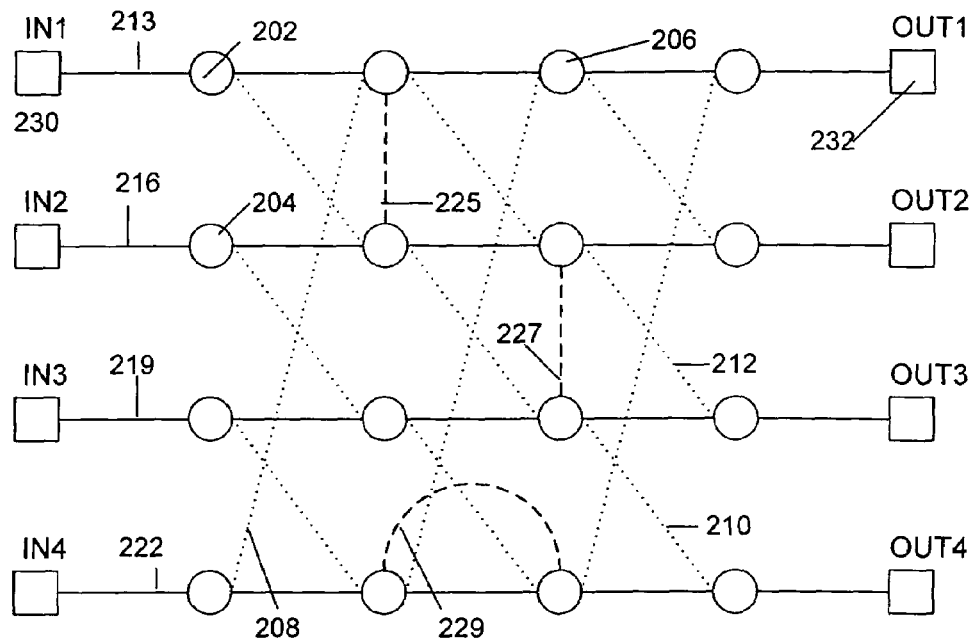
FIGS. 2A and 2B illustrate example configurations for detecting bridging faults in a programmable device according to an embodiment of the invention.
Figure 2B:
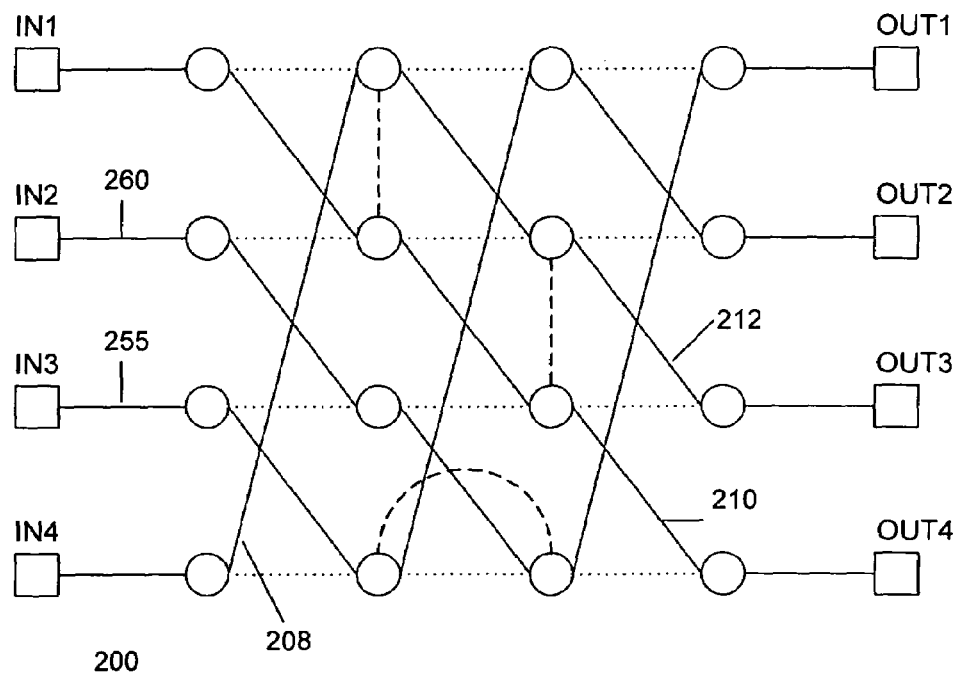

FIGS. 2A and 2B illustrate example configurations for detecting bridging faults in a programmable device according to an embodiment of the invention. FIG. 2A illustrates a programmable device 200 having number of programmable connections, which are represented as circles, including connections 202, 204, and 206. These connections of the programmable device 200 can include units such as single input functions and multiplexers.

Interconnect resources are connected by programmable interconnections to other resources and/or to input or output test points. Test points can include registers within the programmable device and pins for electrically interfacing the programmable device with other external devices. A chain of interconnect resources, represented as a solid line between two or more circles, connects a set of interconnect resources serially with at least one input test point and at least one output test point via the programmable interconnections. Interconnect resources are also referred to as conductive lines or lines for short. In device 200, there are four chains, 213, 216, 219, and 222, each connected with one input test point, for example 230, and one output test point, for example 232. The input test point 230 is connected with the head of a chain to control the digital level of the chain, and the output test point 232 is connected with the tail of a chain to observe the digital level of the chain.

Test programs detect bridging faults among chains by toggling all the chains simultaneously and observing their digital levels. Programmable device 200 includes bridging faults 225, 227, and 229. In the device configuration in FIG. 2A, bridging fault 225 can be detected by toggling chains 213 and 216 to opposite values. The bridging fault 225 would cause the values captured at the output test points of chains 213 and 216 to be either all high (e.g. 1) or all low (e.g. 0), depending on the relative drive strengths of the bridged lines. The device configuration of FIG. 2A can detecting bridging faults 225 and 227, but cannot detect bridging fault 229, which occurs between two resources in the same chain, 222.

To detect all of the bridging faults, such as bridging fault 229, a different configuration must be used. In this alternate configuration, another set of chains is created in which resources in the same chain in the configuration of FIG. 2A cannot be on the same chain in the second configuration. The set of chains in FIG. 2A is referred to as a primary set of chains, and one or more alternate sets of chains are referred to as complement sets of chains. Depending on the number of resources and the degree of connectivity between them in a given programmable device, there may be many complement sets of chains required for complete testing.

FIG. 2B illustrates programmable device 200 in a different configuration. The programmable nature of the interconnections allows additional unused interconnections, represented as dotted lines, to form alternate chains in different device configurations. For example, lines 208, 210, and 212 are unused in the configuration shown in FIG. 2A, but form part of chains in the configuration of FIG. 2B. In the configuration of FIG. 2B, bridging fault 229 is between resources in two different chains, 255 and 260; thus fault 229 can be detected by toggling chains 225 and 260 to opposite values.

As illustrated by FIGS. 2A and 2B, testing an entire device for bridging faults includes configuring the device with one or more sets of chains and toggling the chains to opposite values to detect bridging faults. To optimize testing efficiency, it is desirable to minimize the number of different configurations of chains (the number of complement sets of chains) used in testing and to minimize the number of test values used in each configuration.

In an embodiment, the connectivity of resources is represented by one or more graphs. Graph nodes are resources and graph edges are interconnections between them. In a further embodiment, the graphs are formed independent of the actual physical layout of interconnections on the programmable device. In this embodiment, as we do not know which chains are physically next to each other, complete testing requires that any two chains be observed when driven to opposite states.

As discussed above, bridging faults 225 and 227 can be detected in the configuration of FIG. 2A because they happen across chains. The bridging fault 229, however, cannot be detected because the faulty resources are connected by chain 222.

Given a set of resources and their associated interconnections, a primary set of chains can be created by user directives, from which complement sets of chains can be created using an optimization algorithm such as genetic algorithm. In an alternate embodiment, both the primary and complementary sets of chains can be created using an optimization algorithm. In either embodiment, the goal is to minimize the number of chains in both sets.

Figure 3:
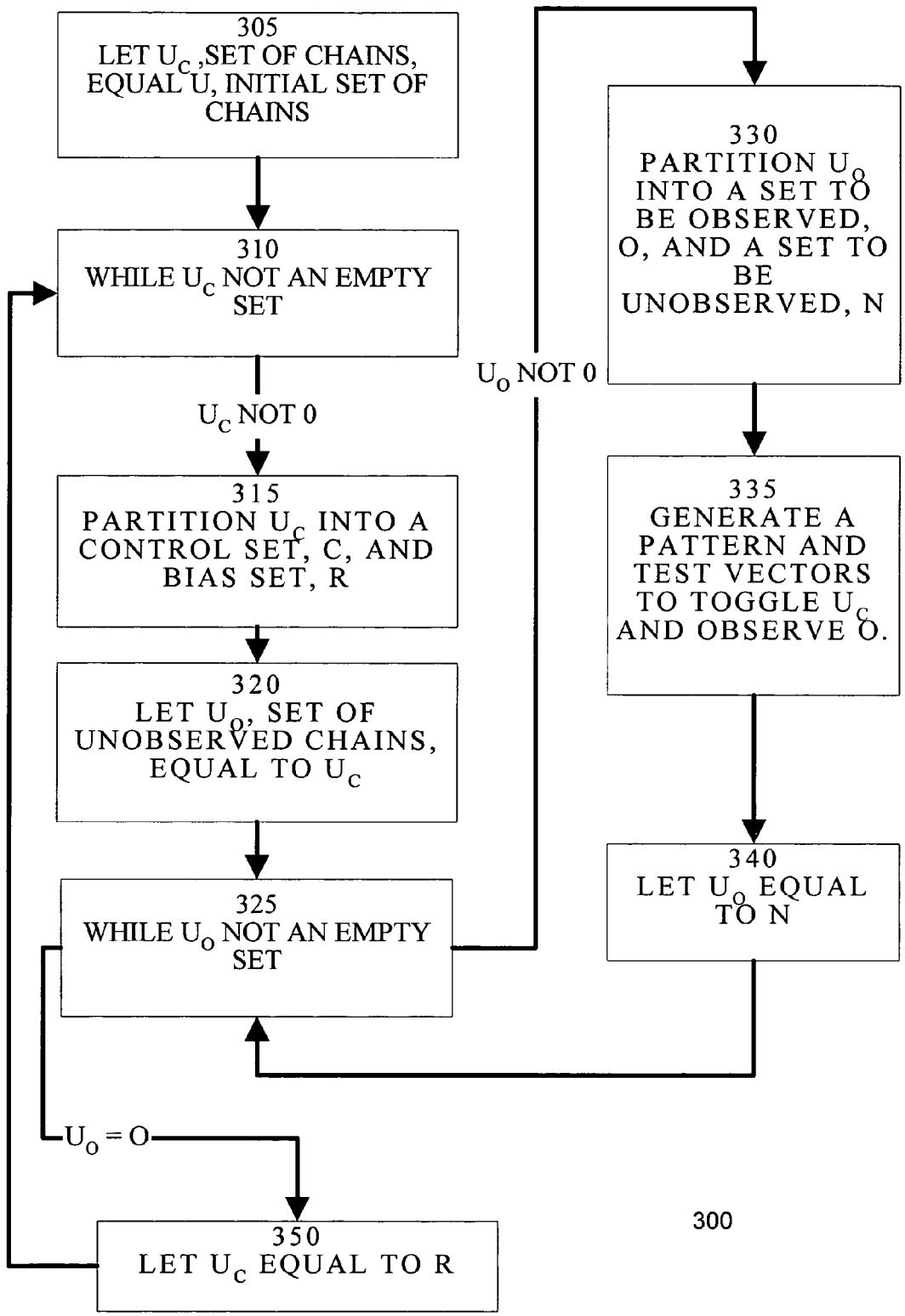
FIG. 3 illustrates a method for automatically generating a test program for detecting bridging faults in a programmable device according to an embodiment of the invention.

Control test points are connected with chains to drive test values onto chains and to observe chain outputs. A test point is said to be a control test point if it controls exactly one chain; a test point is said to be a bias test point if it controls more than one chain. Let U be a set of chains (primary or complement) of resources that we want to check if there is any bridging among chains. Given U, FIG. 3 illustrates a method 300 for automatically generating a test program for detecting bridging faults in a programmable device according to an embodiment of the invention.

At step 305, $U_c$ is initialized to be equal to U, an initial set of chains. $U_c$ and $U_o$, discussed below, are variables representing a set of chains. At step 310, if $U_c$ is not an empty set, the method 300 proceeds to step 315; otherwise, the method 300 is halted and the test program is complete.

At step 315, the set $U_c$ is partitioned into C, a set of chains each controlled by a control test point, and R, a set of chains controlled by one or more bias test points, or as discussed in detail below, interconnect bias circuitry. Step 315 dynamically assigns one or more chains to the available test points of the programmable device, such that each chain in the set $U_c$ is either driven by a bias test point or a control test point. Further, $U_o$ is initialized to be equal to $U_c$ at step 320. $U_o$ represents the set of chains yet to be observed by a previously created test configuration and vectors.

At step 325, if $U_o$ is not an empty set, the method 300 proceeds to step 330; otherwise, the method 300 proceeds to step 350, discussed in detail below. Step 330 further partitions $U_o$ into O, a set of chains to be observed by a currently created test configuration, and set N, a set of chains which will not be observed by the currently created test configuration. Step 335 then creates a set of test configurations and vectors to toggle the values of the set of chains $U_c$ and observe the values of O. The test configurations and associated vectors are stored with test configurations and vectors generated from previous iterations of method 300.

At step 340, $U_o$, the set of chains yet to be observed by a previously created test configurations and vectors, is set to be N, the set of chains remaining unobserved after step 335. At step 325, $U_o$ is again checked to see if it is an empty set. If $U_o$ is not an empty set, then there are still chains remaining which need to be observed, and steps 330, 335, and 340 are repeated.

If $U_o$ is an empty set, then all of the chains from $U_c$ have been observed; however, the set of chains in R have been biased, but not controlled in the previous iterations of steps 330, 335, and 340. Therefore, step 350 sets $U_c$ equal to R, the set of bias chains from the previous iteration of the method 300, and steps 310–340 are repeated for the new, smaller $U_c$ to test for bridging faults between these chains. When the method 300 is complete, the test program includes all of the previously created test configurations and vectors.

The formation of the complement set of chains requires that resources in the same chain in the primary set cannot be on the same chain in the complement set. The longer the chains in the primary set, the larger the number of chains in the complement set will be. In other words, more input test points will be needed to control chains in the complement set if we try to minimize the number of test points needed in the primary set by connecting resources together. In theory, if there are N interconnect resources, then a chain of size N would balance the number of input test points needed in both sets.

Figure 4:
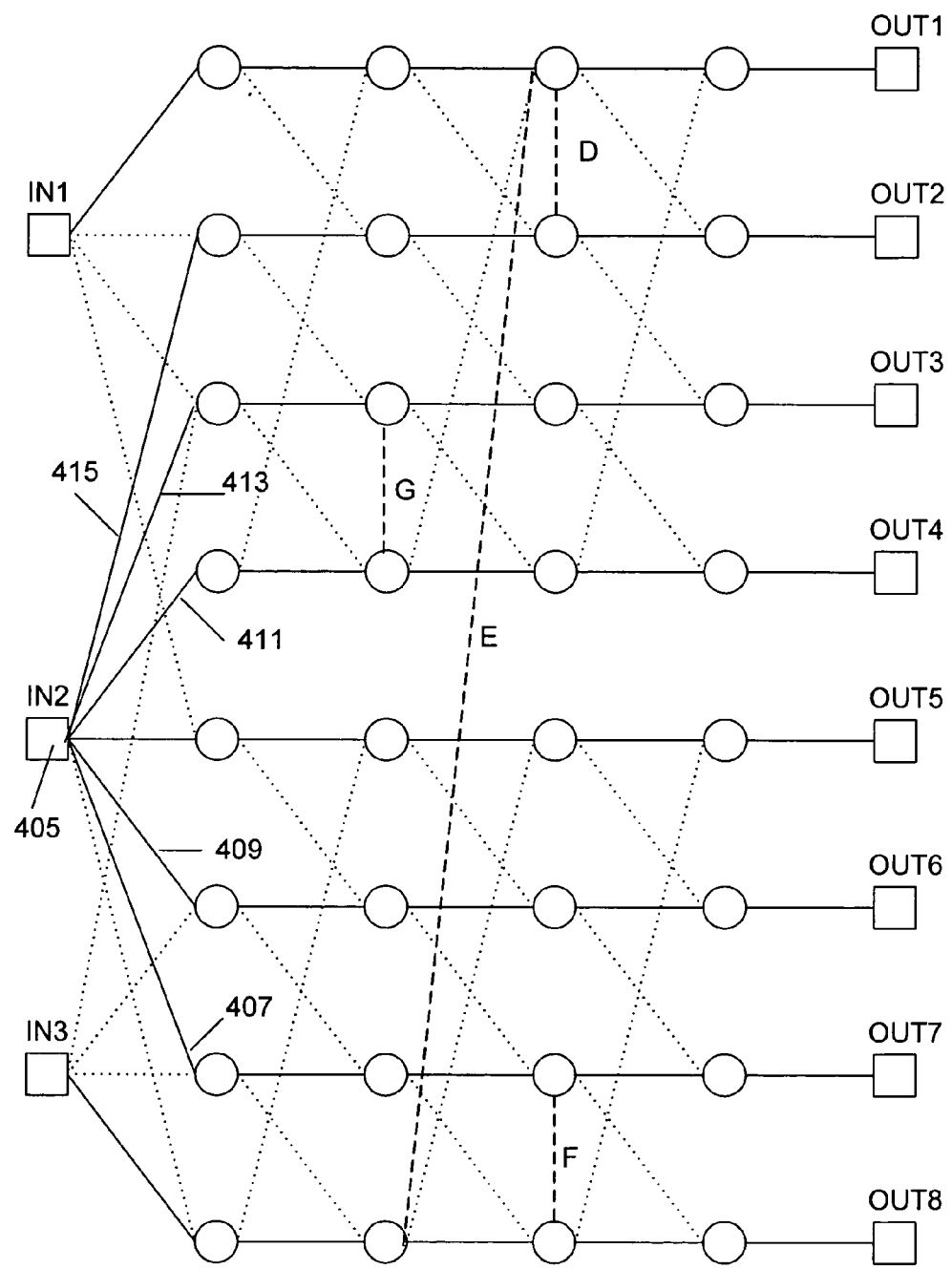
FIG. 4 illustrates an example application for detecting bridging faults in a programmable device with a limited number of inputs.

As discussed above, there is typically substantially more programmable interconnections, and hence more chains, than there are test points to drive and observe them. If $\sqrt{N}$ is still greater than the number of accessible input test points, an embodiment shares some input test points with multiple chains. FIG. 4 illustrates an example application for detecting bridging faults in a programmable device with a limited number of inputs. In creating primary and complement sets of chains, an embodiment connects multiple chains with a single test point, referred to as bias test point. In FIG. 4, test point 405 is connected with chains 407, 409, 411, 413, and 415.

Similarly, the number of output test points available to observe the state of chains during testing may also be less than the number of chains. In an embodiment, multiple chains are associated with an output test point. Each chain is operated independently by keeping the mapping between input test points and chains unchanged and remapping the output test points with different test configurations and vectors, without adding any complexity into the original bridging problem.

Figure 5A:
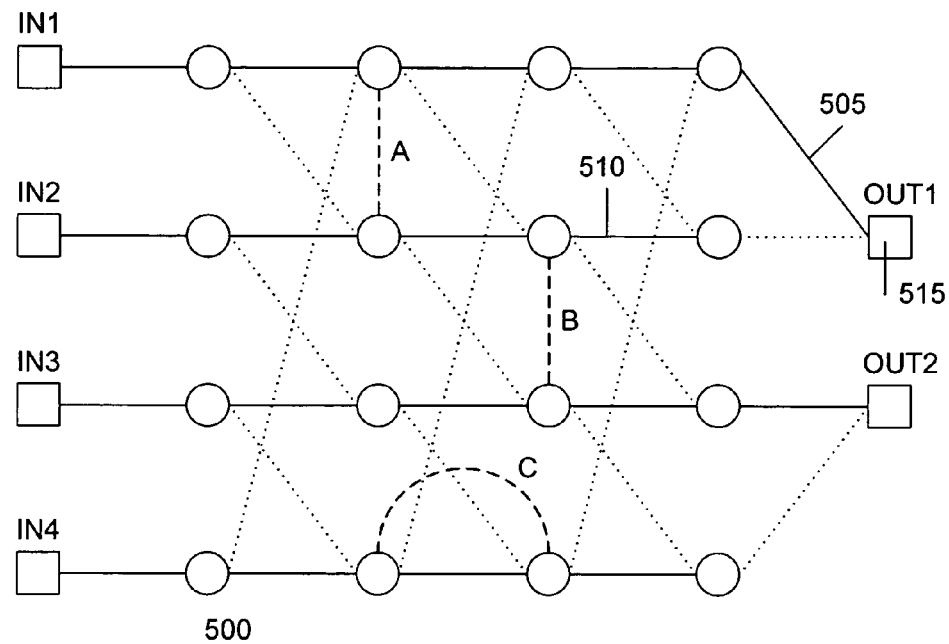
FIGS. 5A and 5B illustrate example applications for detecting bridging faults in a programmable device with a limited number of outputs.
Figure 5B:
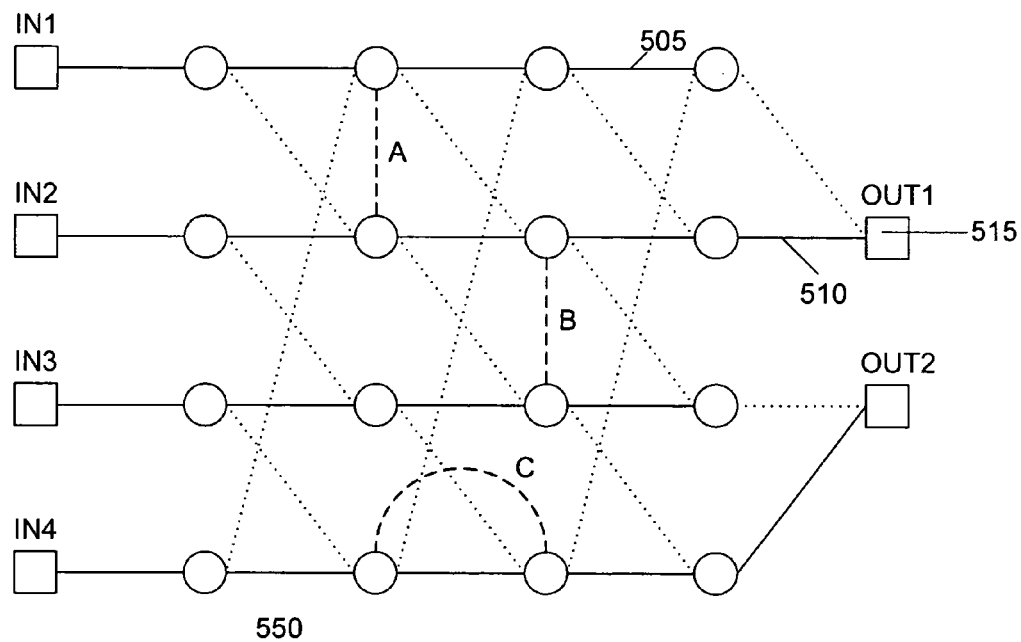

FIGS. 5A and 5B illustrate example applications for detecting bridging faults in a programmable device with a limited number of outputs. FIG. 5A illustrates a first configuration 500 in which chains 505 and 510 share output test point 515. In configuration 500, only chain 505 is connected with the output test point 515. FIG. 5b illustrates an alternate configuration 550 in which chain 510 is connected with the output test point 515. This example requires two configurations to observe all the chains. Additionally, this example requires four configurations (two for the primary set of chains and two for the complement set of chains) to detect bridging faults between any two resources. Typically, the number of chains divided by the number of available output test points determines the lower bound on the number of configurations needed to observe all the chains. The routing network imposes further constraints on which output test points are accessible by which chains; these also affect the actual number of configurations needed to observe all the chains.

In order to ensure full coverage, all lines need to be able to be controlled both high and low. Controlling all interconnect segments concurrently while allowing each chain to be toggled independently can be difficult in many architectures. In many cases, when some chains are connected with a set of test points, other chains cannot be driven independently due to the device configuration, requiring subsequent configurations to explicitly control the chains that cannot be driven independently in a given configuration.

Figure 6:
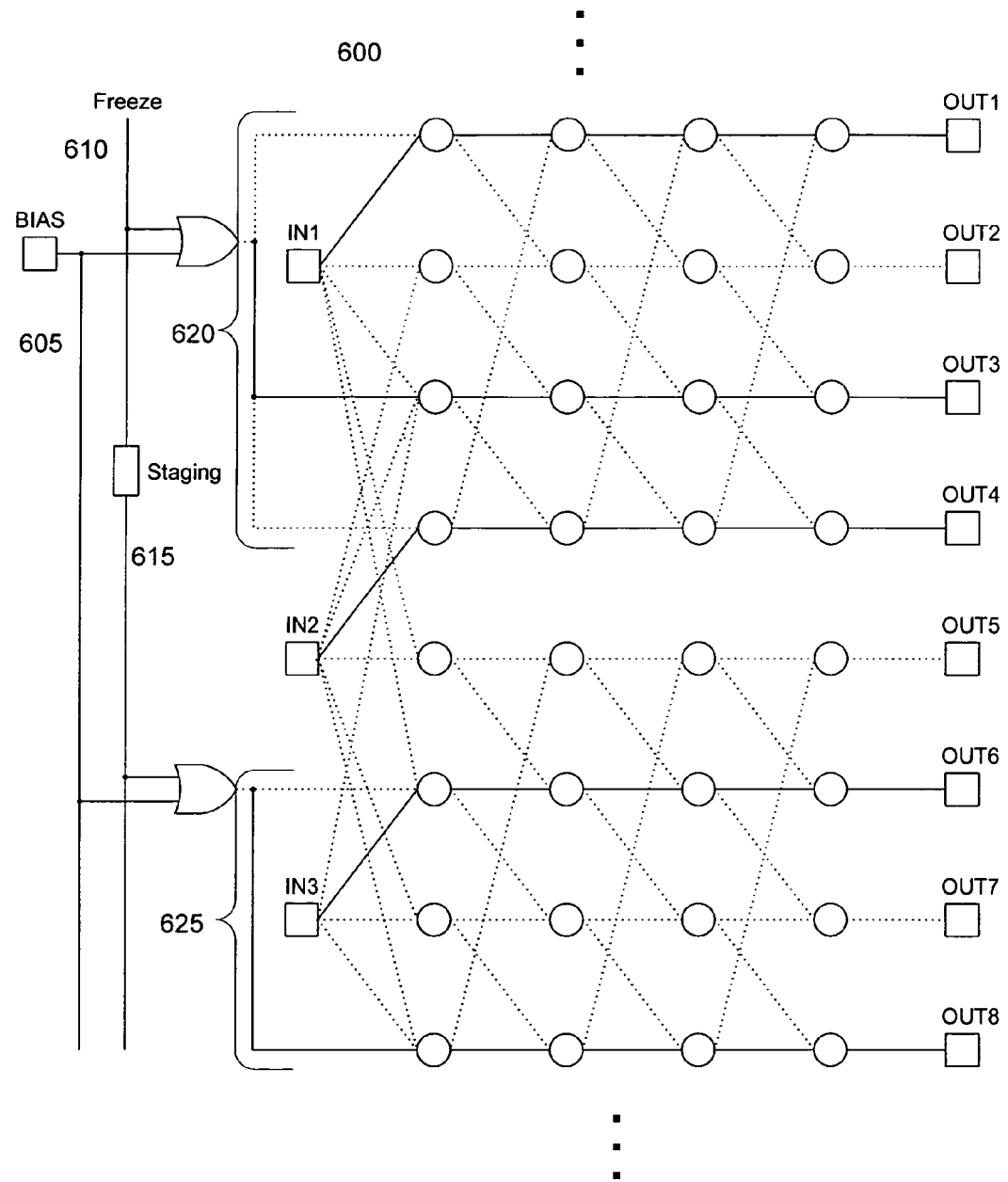
FIG. 6 illustrates an improvement to a programmable device that increases the efficiency of detecting bridging faults according to an embodiment of the invention.

FIG. 6 illustrates an improved programmable device 600 that increases the efficiency of detecting bridging faults. The programmable device of FIG. 6 includes an interconnect bias circuit to allow lines unconnected with input test points to be controlled with a bias signal 605. In an embodiment, the bias signal can either be set internally using a control test point or received from an external source via a separate pin. Unlike implicit control systems previously used, in which a half latch is used to pull unconnected lines high, the interconnect bias circuit can apply any bias value, for example ground or Vcc, to all unconnected lines. The interconnect bias circuit is different from previously mentioned bias test points in that it is a specialized global test point. In the previous cases, multiple bias test points would most likely be required in order to completely bias all lines not included in the control set C.

In device 600, a freeze signal 610 from the control block of the device is utilized to allow the bias signal 605 to be toggled without switching all of the bias-controlled lines simultaneously, in order to avoid large power surges in the device. After the value of the bias signal 605 has been changed, the freeze signal 610 allows the bias value to be applied in stages to all of the unconnected lines of the device 600.

In an embodiment, the programmable interconnections are divided into two or more groups, such as group 620 and 625. A staging circuit 615, in conjunction with the freeze signal 610, delays the application of the bias signal to bank 625 to prevent power surges. In devices with a large number of groups, an embodiment uses staging devices between each group to prevent power surges. An embodiment of staging circuit 615 is a test point or delay element.

Using the interconnect bias circuit allows more of the control test points to be used for explicit control. This in turn allows for fewer overall configurations. All of the bias-controlled chains are treated as a single entity, which can be held either high or low while the explicitly controlled chains are exercised. Then, one more vector needs to be applied where the bias value changes, and all of the explicitly controlled chains are held at the opposite value.

For example, the programmable device 600 only requires three configurations to detect all bridging faults. Without the interconnect bias circuit, one of the input test points would need to be used as a bias test point and connected with a number of different chains, as discussed above. In this example, the number of required configurations would increase to four. In more realistic architectures, with thousands of interconnections to be tested, the configuration savings is even more significant.

In method 300, one control test point removes one chain from the $U_c$ in each iteration of the outermost loop. A further embodiment of this method removes at most $N^2$ chains with N input test points in 2 iterations of the outermost loop in the original algorithm by exploring parallelism in the routing network. This technique would help to reduce the number of configurations due to limited number of control test points.

Figure 7A:
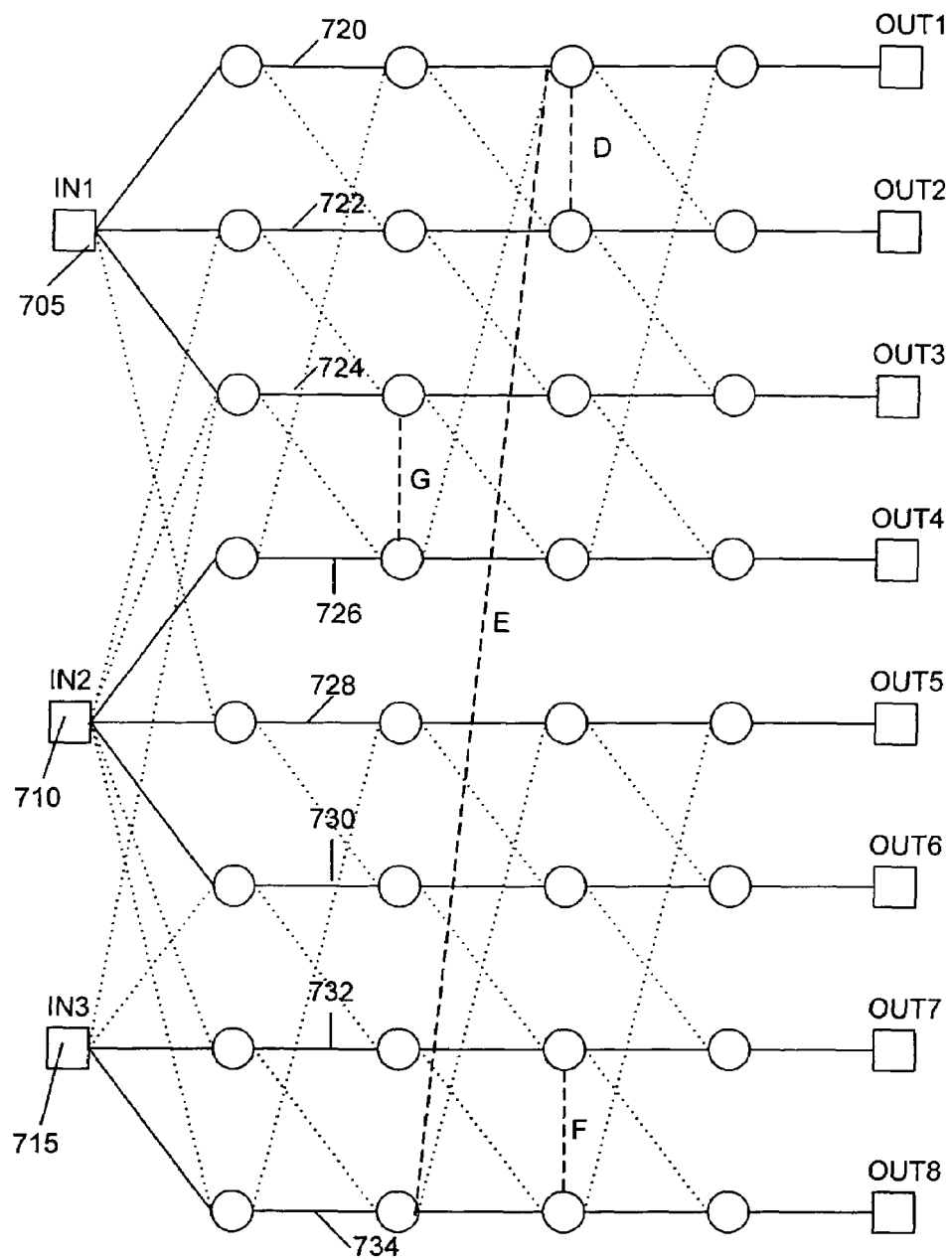
FIGS. 7A and 7B illustrate the application of an alternate method for automatically generating a test program for detecting bridging faults in a programmable device according to an embodiment of the invention.
Figure 7B:
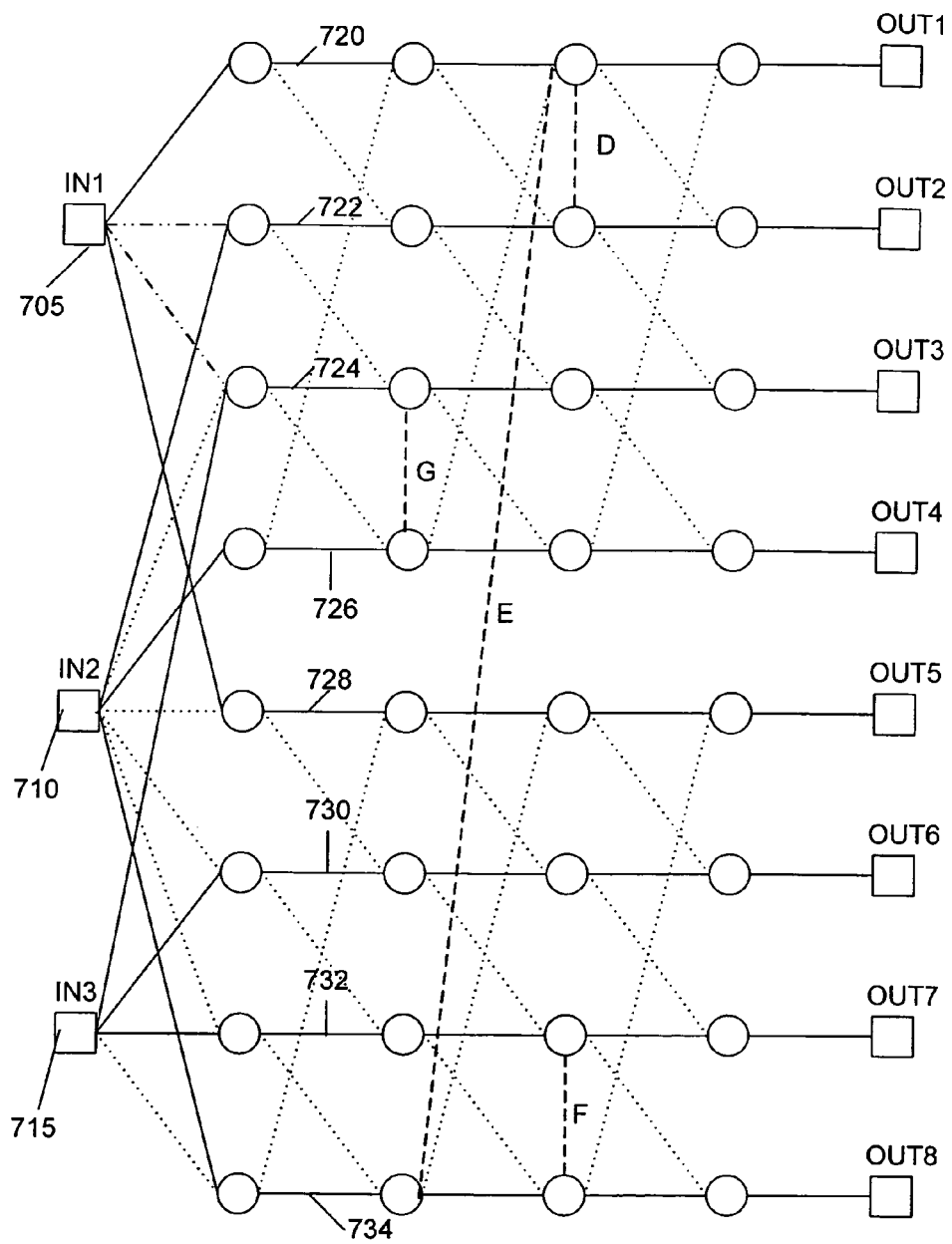

FIGS. 7A and 7B illustrate the application of an alternate method for automatically generating a test program for detecting bridging faults in a programmable device according to an embodiment of the invention. As previously discussed, by using two control test points and one bias test point, all the potential bridging faults among chains are detected using four configurations. In FIGS. 7A and 7B, all the potential bridging faults among chains are detected with only two configurations in which all three input test points are used as bias test points.

In FIG. 7A, input test point IN1, 705 controls the chains 720, 722, and 724; input test point IN2, 710 controls the chains 726, 728, and 730; and input test point IN3 715 controls the chains 732 and 734. FIG. 7B shows an alternate configuration of the programmable device in which IN1 705 controls chains 720 and 728, IN2 710 controls the chains 722, 726, and 734; and IN3 715 controls the chains 724, 730, and 732. In both configurations, eight chains are partitioned into three sets and a single test point controls each set. In each configuration, any bridging faults among sets can be detected but any bridging faults within a set cannot be detected. Notice that any chain in the same set in the first configuration is not in the same set in the second configuration. By doing so any bridging faults within a set in the first configuration could be detected in the second configuration.

Stated more formally, the alternate method illustrated by FIGS. 7A and 7B is as follows:

Let U be a set of chains, S⊆U and a set of input test points R. All bridging faults among chains in S could be detected in two configurations if the following conditions are satisfied:

R is not being used by U−S

There exists 2 configurations $1^{st}$ configuration: ∀s∈S, s could be controlled by some r∈R $2^{nd}$ configuration:

∀s ∈S, s could be controlled by some r∈R, and ∀$s_1,s_2$ ∈S, If both $s_1$ and $s_2$ are controlled by the same r∈R in the $1^{st}$ configuration, then $s_1$ could be controlled by some $r_1$∈R and $s_2$ could be controlled by some $r_2$∈R such that $r_1 \neq r_2$ The invention includes a bridging fault detection system that allows for a high amount of test coverage using a low number of test configurations and further enables the bridging fault detection system to automatically create optimal test configurations and test vectors without the need for precise layout information. An embodiment of the invention is readily adaptable to complex programmable device architectures. A further embodiment of the invention includes interconnect bias circuitry to decreases the number of test configurations and thus the time needed to test for bridging faults. Although the invention has been discussed with respect to specific examples and embodiments thereof, these are merely illustrative, and not restrictive, of the invention. Thus, the scope of the invention is to be determined solely by the claims.

What is claimed is:

1. A method for creating a test program for detecting bridging faults in a programmable device, the method comprising:
    forming a set of chains adapted to detect at least one potential bridging fault;
    partitioning the set of chains into a control subset associated with at least one control test point and a bias subset associated with at least one bias source;
    partitioning the set of chains into an observation subset and a nonobservation subset; and
    creating a test configuration and a test vector adapted to drive at least one set of test values on the control subset and to drive at least one bias value on the bias subset, wherein the test configuration is further adapted to observe the output of the observation subset.

2. The method of claim 1, further comprising:
    removing the observation subset from the set of chains, thereby forming a reduced set of chains;
    repeating the step of partitioning into an observation subset and a nonobservation subset and the step of creating a test configuration and a test vector for the reduced set of chains.

3. The method of claim 1, further comprising:
    removing the control subset from the set of chains, thereby forming a reduced set of chains;
    repeating the steps of partitioning into a control subset and a bias subset, of partitioning into an observation subset and a nonobservation subset, and of creating a test configuration and a test vector for the reduced set of chains.

4. The method of claim 1, wherein forming a set of chains comprises:
    forming a primary set of chains based upon the connectivity of a set of resources of the programmable device; and
    forming at least one complement set of chains based upon the primary set of chains.

5. The method of claim 4, wherein the primary set of chains is specified by a set of user directives.

6. The method of claim 4, wherein the complement set of chains is determined using an optimization algorithm.

7. The method of claim 1, wherein a control test point is associated with each chain of the control subset.

8. The method of claim 1, wherein a control test point is associated with at least two chains of the control subset.

9. The method of claim 1, wherein the bias source is a test point of the programmable device connected with the chains of the bias subset and adapted to drive the chains of the bias subset to a bias value.

10. The method of claim 1, wherein the bias source is an interconnect bias circuit of the programmable device adapted to drive chains unconnected with control test points to a bias value.

11. The method of claim 10, wherein the interconnect bias circuit is adapted to receive a bias value from a bias pin of the programmable device.

12. The method of claim 10, wherein the interconnect bias circuit is adapted to receive a bias value from a test point of the programmable device.

13. The method of claim 1, wherein the test configuration includes at least one programmable device configuration.

14. The method of claim 13, wherein the test configuration includes a first programmable device configuration adapted to connect a first chain with an output test point for observation and a second programmable device configuration adapted to disconnect the first chain from the output test point and connect a second chain with the output test point for observation.

15. The method of claim 1, wherein the test vector is adapted to drive a set of test values on the set of chains, such that each chain has a state opposite to the state of each of the other chains of the set for at least one test value.

16. An information storage medium including a set of instructions adapted to operate an information processing device to perform a set of steps, the set of steps comprising:
    forming a set of chains adapted to detect at least one potential bridging fault;
    partitioning the set of chains into a control subset associated with at least one control test point and a bias subset associated with at least one bias source;
    partitioning the set of chains into an observation subset and a nonobservation subset; and
    creating a test configuration and a test vector adapted to drive at least one set of test values on the control subset and to drive at least one bias value on the bias subset, wherein the test configuration is further adapted to observe the output of the observation subset.

17. The information storage medium of claim 16, further comprising:
    removing the observation subset from the set of chains, thereby forming a reduced set of chains;
    repeating the step of partitioning into an observation subset and a nonobservation subset and the step of creating a test configuration and a test vector for the reduced set of chains.

18. The information storage medium of claim 16, further comprising:
    removing the control subset from the set of chains, thereby forming a reduced set of chains;
    repeating the steps of partitioning into a control subset and a bias subset, of partitioning into an observation subset and a nonobservation subset, and of creating a test configuration and a test vector for the reduced set of chains.

19. The information storage medium of claim 16, wherein forming a set of chains comprises:
    forming a primary set of chains based upon the connectivity of a set of resources of the programmable device; and
    forming at least one complement set of chains based upon the primary set of chains.

20. The information storage medium of claim 19, wherein the primary set of chains is specified by a set of user directives.

21. The information storage medium of claim 19, wherein the complement set of chains is determined using an optimization algorithm.

22. The information storage medium of claim 16, wherein a control test point is associated with each chain of the control subset.

23. The information storage medium of claim 16, wherein a control test point is associated with at least two chains of the control subset.

24. The information storage medium of claim 16, wherein the bias source is a test point of the programmable device connected with the chains of the bias subset and adapted to drive the chains of the bias subset to a bias value.

25. The information storage medium of claim 16, wherein the bias source is an interconnect bias circuit of the programmable device adapted to drive chains unconnected with control test points to a bias value.

26. The information storage medium of claim 25, wherein the interconnect bias circuit is adapted to receive a bias value from a bias pin of the programmable device.

27. The information storage medium of claim 25, wherein the interconnect bias circuit is adapted to receive a bias value from a test point of the programmable device.

28. The information storage medium of claim 16, wherein the test configuration includes at least one programmable device configuration.

29. The information storage medium of claim 28, wherein the test configuration includes a first programmable device configuration adapted to connect a first chain with an output test point for observation and a second programmable device configuration adapted to disconnect the first chain from the output test point and connect a second chain with the output test point for observation.

30. The information storage medium of claim 16, wherein the test vector is adapted to drive a set of test values on the set of chains, such that each chain has a state opposite to the state of each of the other chains of the set for at least one test value.

31. A programmable device, comprising:
a plurality of resources;
a plurality of programmable interconnections adapted to selectively connect two or more of the plurality of resources;
a plurality of control test points selectively connected with at least a first portion of the plurality of programmable interconnections and adapted to drive the first portion of the plurality of programmable interconnections to a state; and
an interconnect bias circuit adapted to drive a second portion of the plurality of programmable interconnections not connected with the plurality of control test points to a bias state.

32. The programmable device of claim 31, wherein the interconnect bias circuit is adapted to receive a bias value from a bias register.

33. The programmable device of claim 31, wherein the interconnect bias circuit is adapted to receive a bias value from a bias pin.

34. The programmable device of claim 31, wherein the second portion of the plurality of programmable interconnections is divided into at least two stages, and the interconnect bias circuit includes a staging circuit adapted to apply the bias value to each stage sequentially.

35. The programmable device of claim 31, further including at least one bias test point selectively connected with a third portion of the plurality of programmable interconnections and adapted to drive the third portion of the programmable interconnections to a test point bias state.

36. The programmable device of claim 31, further comprising at least one output test point selectively connected with at least a subset of the first portion of programmable interconnections and further adapted to observe the state of the subset of the first portion of programmable interconnections.

* * * * *